United States Patent
Elschner et al.

[11] Patent Number: 5,917,279
[45] Date of Patent: Jun. 29, 1999

[54] INTERMEDIATE LAYER IN ELECTROLUMINESCENT ARRANGEMENTS CONTAINING FINELY DIVIDED INORGANIC PARTICLES

[75] Inventors: Andreas Elschner, Mülheim/Ruhr; Rolf Wehrmann, Krefeld; Kai Bütje, Duisburg, all of Germany

[73] Assignee: Bayer Aktiengesllschaft, Germany

[21] Appl. No.: 08/745,999

[22] Filed: Nov. 12, 1996

[30] Foreign Application Priority Data

Nov. 20, 1995 [DE] Germany ............... 195 43 205

[51] Int. Cl.⁶ .............. H01J 1/62; H01J 63/04; B32B 9/00; B32B 19/00
[52] U.S. Cl. ............. 313/506; 313/502; 313/503; 428/690; 428/917
[58] Field of Search .................... 313/506, 503, 313/502, 504, 505, 507–9; 315/169.3; 428/690, 917

[56] References Cited

U.S. PATENT DOCUMENTS

| | | |
|---|---|---|
| 3,264,133 | 8/1966 | Brooks ..................... 313/506 |
| 5,231,329 | 7/1993 | Nishikitani et al. . |
| 5,247,190 | 9/1993 | Friend et al. . |
| 5,569,530 | 10/1996 | Dooms et al. ................ 428/323 |
| 5,767,622 | 6/1998 | Hueppauff et al. .............. 313/503 |

FOREIGN PATENT DOCUMENTS 0 637 899   2/1995   European Pat. Off. .

OTHER PUBLICATIONS

Appl. Phys. Lett. 57 (6), Aug. 6, 1990, (pp. 531,532).

Appl. Phys. Lett. 51 (12) 21, Sep. 1987 (pp. 913–915).

Appl. Phys. Lett. 61 (23), Dec. 7, 1992 (pp. 2793–2795).

*Primary Examiner*—Thomas M. Sember
*Assistant Examiner*—Mack Haynes
*Attorney, Agent, or Firm*—Connolly & Hutz

[57] ABSTRACT

The present invention relates to intermediate layers of inorganic materials in electroluminescent arrangements which contain finely divided inorganic particles (nanoparticles) dispersed in a polymer binder.

10 Claims, 1 Drawing Sheet

INTERMEDIATE LAYER IN ELECTROLUMINESCENT ARRANGEMENTS CONTAINING FINELY DIVIDED INORGANIC PARTICLES

BACKGROUND OF THE INVENTION

The present invention relates to intermediate layers of inorganic materials in electroluminescent arrangements or devices respectively, containing finely divided inorganic particles (nano-particles) dispersed in a polymer binder.

Current-operated, light-emitting arrangements are of great importance in our opto-electronic age. The development of optical display elements aims towards arrangements which are flat, can be operated with a large area, are highly efficient and are low in production costs. There are a number of different possibilities of producing electrically operated light-emitting arrangements. However, only two classes of system are known which combine the requirements of large area, flatness and cheap production.

1) Doped ZnS Particles in a Binder Matrix

The ZnS particles are incorporated into a thin layer and luminesce upon the application of a high-frequency electric field. The luminance of the ZnS systems is low. A further disadvantage consists in the high operating voltage required at a high frequency.

2) Electroluminescent Polymers

Polymer LEDs based on poly(phenylene)vinyls were described for the first time by Friend et al (U.S. Pat. No. 5,247,190). In the simplest construction the polymer is arranged between a transparent anode (e.g. ITO) and a vapour-deposited cathode (e.g. Ca, Al). The arrangement emits light when a voltage is applied.

The most general example of a layer construction in an organic LED is described in EP A-0 637 899 wherein additional layers, which exert a positive influence upon the function of the light-emitting arrangements, are also described. The properties of LEDs constructed from organic components can be distinctly improved by the introduction of additional organic layers (Tang et al. Appl. Phys. Lett. 51 (1987) 913). For this purpose one or two charge-injecting layers are introduced between the electroluminescent layer and the two electrodes. These charge-injecting layers can consist of vapour deposited monomers (Adachi et al. Appl. Phys. Lett. 57 (1990) 531), polymers (U.S. Pat. No. 5,231,329) or monomers dispersed in polymers (Brown et al. Appl. Phys. Lett. 61 (1992) 2739). These are for example oxadiazoles or tertiary amines. Polymers with oxadiazole structures were also described. The molecules are always organic.

SUMMARY OF THE INVENTION

The invention relates to intermediate layers containing finely divided inorganic particles (nano-particles), dispersed in a polymer binder, in light-emitting arrangements or diodes (LED) and to the use of the nano-particles for the production of intermediate layers in LEDs and light-emitting (electroluminescent) arrangements containing one or more of these intermediate layers.

BRIEF DESCRIPTION OF THE DRAWINGS

Novel features and advantages of the present invention in addition to those noted above will become apparent to persons skilled in the art from a reading of the following detailed description in conjunction with the accompanying drawings wherein.

DETAILED DESCRIPTION OF THE INVENTION

Figure 1:
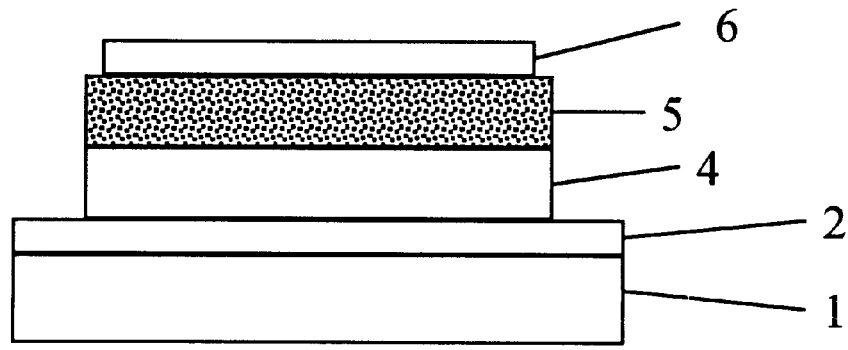
FIG. 1 is a diagrammatic view of a light emitting diode A, according to the present invention.
Figure 2:
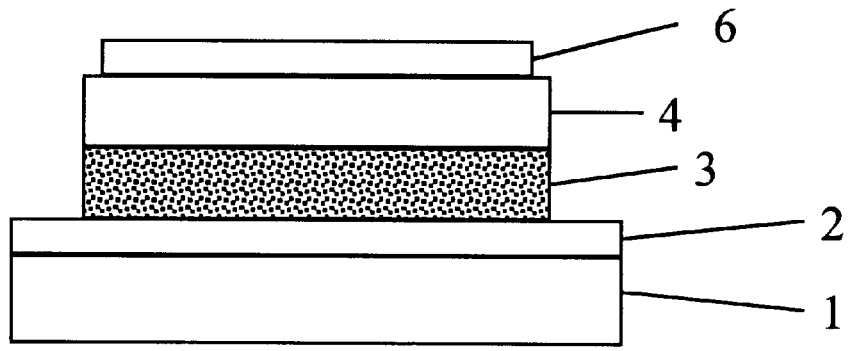
FIG. 2 is a diagrammatic view of another light emitting diode B, according to the present invention.
Figure 3:
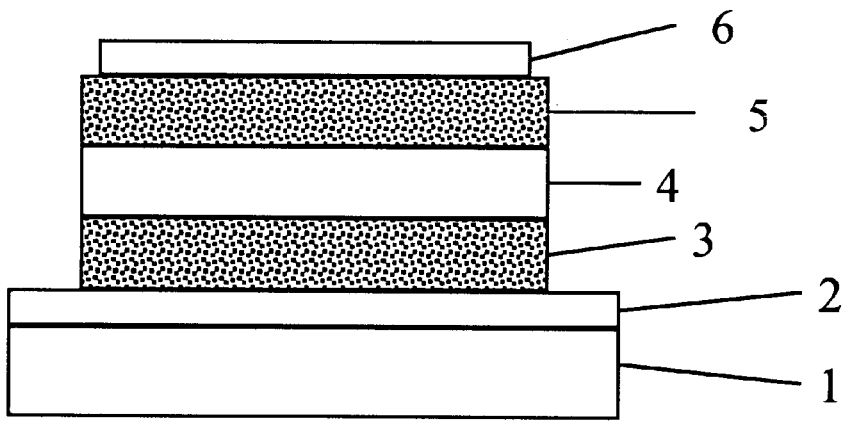
FIG. 3 is a diagrammatic view of still another light emitting diode C, according to the present invention.

FIGS. 1, 2 and 3 illustrate light emitting diodes (LED) A, B, and C. These figures illustrate a transparent substrate 1, a transparent anode 2, an intermediate layer 3 containing nano-particles, an electroluminescent layer 4, another intermediate layer 5 containing nano-particles, and a cathode 6.

The nano-particles generally have a diameter of <1 $\mu$m, preferably 1–100 nm. The size of the particles is determined using high-resolution transmission electron microscopy or ultracentrifugation. The particles preferably consist of semi-conducting material, where the band gap, i.e. the energy difference between the valence- and the conduction- band is to amount to at least 1 eV. Suitable finely divided inorganic (nano-disperse) particles are for example metal oxides such as $TiO_2$, $SnO_2$, $ZnO$, $WO_3$, $Al_2O_3$, $Fe_2O_3$ or semiconductor compounds from the III and V main groups of the Periodic System (III-V semiconductors) such as e.g. GaP, AlN, or semiconductor compounds from the II and VI main groups of the Periodic System (II-VI semiconductors) such as e.g. ZnSe, CdSe, CdS (Mendelejew Periodic System).

Nano-particles composed of titanium dioxide are particularly preferred.

The concentration of the nano-particles in the polymer binder is between 0.1 and 90 wt. %, preferably between 1 and 70 wt. % and particularly preferably between 5 and 60 wt. % (relative to the weight of the intermediate layer).

The nano-particles are dispersed in polymer binders for the later layer production. Amorphous polymers which can be processed to form transparent films are preferably suitable as binders. These are for example polycarbonates, polystyrene and copolymers of polystyrene such as SAN, cyclic polyolefins, polysulphone, (meth)acrylate polymers and/or copolymers, polyvinyl alcohol, polyvinyl, carbazole, vinyl acetate copolymers or polyvinyl pyrrolidone.

The invention further provides the use of finely divided inorganic particles, dispersed in a polymer binder, for the production of intermediate layers in electroluminescent arrangements.

The invention further provides electroluminescent arrangements containing one or more, generally one or two, of the above described intermediate layers and the use of the electroluminescent arrangement for the production of luminous displays.

The schematic arrangement of LED is for example as follows:

A) (FIG. 1) Cathode 6 (e.g. Al, Ca, Mg)/intermediate layer 5 containing nano-particles/electroluminescent layer 4 transparent anode 2 (In-Sn-oxide) transparent substrate 1 (e.g. glass or film), B) (FIG. 2) cathode 6/electroluminescent layer 4/intermediate layer 3 containing nano-particles/transparent anode 2/transparent substrate 1.

C) (FIG. 3) cathode 6/intermediate layer 5 containing nano-particles/electroluminescent layer 4/intermediate layer 3 containing nano-particles/transparent anode 2/transparent substrate 1.

The intermediate layers are arranged as follows:

A) as intermediate layer 5 between the electroluminescent layer 4 and the cathode 6 or B) as intermediate layer 3 between the electroluminescent layer 4 and the anode 2 or C) as intermediate layers 5, 3 both between the cathode 6 and the electroluminescent layer 4 and also between the anode 2 and the electroluminescent layer 4.

The system of nano-particles in polymer binders can be applied by spin-coating, immersion-coating and blade coating over a large area in the form of a thin film as intermediate layer in polymer LEDs. The advantage of cost-reducing, large-area production of polymer LEDs is retained.

The properties of the polymer LEDs constructed from polymers (corresponding to U.S. Pat. No. 5,247,190) are distinctly improved by these intermediate layers. Thus the efficiency of the electroluminescence is substantially increased. With the same applied voltage, the direct current flowing through the arrangement is distinctly lower but the electroluminescence intensity remains the same or is even increased.

The layers according to the invention are characterised not only by an increase in efficiency but also by improved long-term stability. In this system the components do not crystallize during operation, as occurs in the case of organic systems consisting of monomers in binders or vapour deposited monomers. At the same time the electroluminescent arrangement is more stable with respect to chemical changes, such as for example oxidation.

Electroluminescent arrangements constructed from polymers with the intermediate layers according to the invention operate at low d.c. voltages. In addition to the simple and cheap production by blade-application of the layer, the luminescence colour can be controlled by varying the chromophoric modules.

The film thickness of the intermediate layer is to be less than 2 $\mu$m, and typically amounts to 10 to 150 nm. Thus high field strengths can be achieved even at low voltages. The intermediate layer according to the invention is characterised by a homogeneous layer thickness and the EL arrangement is dielectrically puncture-proof even with high field strengths of typically >$10^6$ V/cm.

Suitable inorganic nano-particles with a diameter of <1 $\mu$m can be produced in different ways:

by precipitation reaction (E. Matijevic, Chem. Mater. 5 (1993) 412–426), in the case of $TiO_2$ for example by hydrolysis of a titanyl sulphate solution and peptisation of the precipitate, washed sulphate-free, in a monobasic acid (EP-A-261 560), by hydrolysis of $TiCl_4$ solution (W. Bauer and G. Tomandl, Ceram. Int. 20 (1994) 189–93);

according to the sol-gel method by hydrolysis of alkoxides such as described for example in J. Livage, Mat. Sci. Forum 152–153 (1994), 43–45; G. W. Keobrugge et al. J. Mater. Chem. 3 (1993), 1095–1100; PCT-WO 93/05 875 AND PCT-WO 91/16 719;

according to the CVR method by the reaction of vaporizable metal compounds (e.g. alkoxides, halides) with excess oxygen or hydrogen and pyrolysis in the gas phase, see U.S. Pat. No. 4,842,832 and K. Y. Kim et al., J. Chem. Engng. Jpn. 27(1994), 657–61;

by plasma synthesis, see Z. Chen. et al, Gongneng Cailiao 23 (1992), 83–87, 105 (Chem. Abstr. 119:277086 c);

by flame hydrolysis e.g. of $TiCl_4$; such products are commercially available under the trade name Degussa P 25;

by reaction of titanyl sulphate solution with deficient alkali (see below).

Nano-particles composed of titanium oxide obtained from titanyl sulphate solution are particularly suitable. The process for the preparation of the particularly suitable nano-disperse titanium dioxide is characterised in that a) a titanyl sulphate solution containing excess of sulphuric acid is added to an alkaline liquid at an elevated temperature until the mixture thus obtained becomes acid-reacting, thus sulphuric acid is present in excess, b) the mixture obtained under a) is cooled, c) then a monobasic acid is added to the mixture obtained according to b), where flocculation of the titanium dioxide nano-particles formed in accordance with a) takes place, d) the flocculation precipitate formed under c) is filtered off and is washed with the same monobasic acid as under c).

To obtain the titanium dioxide sol according to the invention, the precipitate obtained after reaction step d) is dissolved in water and/or alcohols containing 1 to 10 carbons atoms and one or more hydroxide groups in the molecule.

The preparation of the nano-disperse $TiO_2$ according to the invention can also be carried out successfully within the framework of a large-scale process, namely $TiO_2$ pigment production in accordance with the sulphate process, and thus is very simple and economical.

The filter residue obtained in the process according to the invention (after step d) can be subjected to inorganic and/or organic follow-up treatment.

In principle any titanyl sulphate solution containing sulphuric acid in excess is suitable as educt (sulphuric acid titanyl sulphate solution). Impurities of metals forming soluble sulphates and chlorides, such as e.g. iron, magnesium, aluminum and alkali metals, in principle are not disturbing in the preparation process, unless the aforementioned elements are disadvantageous to the respective purpose of use even in traces. Thus it is possible to carry out the process according to the invention on a large scale. As educt can be used, e.g. black liquor, such as is produced in the sulphate process after the digestion of ilmenite and/or titanium slag with sulphuric acid, the dissolution of the digestion cake in water and filtration.

The production process is not limited, however, to black liquor as educt. Other processes for the production of a sulphuric acid titanyl sulphate solution suitable as educt are for example:

a) dissolution/digestion of titanium dioxide and $TiO_2$ hydrates, e.g. ortho-titanic acid, metatitanic acid, in excess $H_2SO_4$;

b) dissolution/digestion of alkali- and magnesium titanates, also in aqueous form, in excess $H_2SO_4$;

c) reaction of $TiCl_4$ with excess $H_2SO_4$ to form $TiOSO_4$ and HCl as described in DE-A 4 216 122.

The products, in particular from a) and c), are used as sulphuric acid titanyl sulphate solutions preferentially when traces of foreign metals (e.g. iron) in the product (nano-disperse titanium dioxide) are undesired.

For an economically effective mode of operation, the sulphuric acid titanyl sulphate solutions to be used in accordance with the invention preferably contain 100 to 260, particularly preferably 170 to 230 g titanium/l, calculated as $TiO_2$.

The acid excess preferably amounts to 0.3 to 4.0, particularly preferably 0.5 to 1.5 mol $H_2SO_4$, per mol $TiOSO_4$.

Preferably aqueous solutions of sodium hydroxide, potassium hydroxide or ammonia are used as alkaline liquids; in principle carbonates of sodium, potassium and ammonium also can be used, although these are less suitable on account of the strong $CO_2$ development. Sodium hydroxide solution is particularly preferred and the implementation of the process will be explained in detail with reference thereto.

The quantity of sodium hydroxide is contrived such that the sodium hydroxide is present in a stoichiometric deficiency relative to the "free sulphuric acid" according to reaction step a). In the context of the sulphate process of $TiO_2$ production, "free sulphuric acid" is understood by the man skilled in the art as the total sulphuric acid content minus the constituent bound in the form of foreign metal sulphates (primarily $FeSO_4$), i.e. the sum of $H_2SO_4$ and sulphuric acid bound as $TiOSO_4$; the last mentioned constituent is present after the hydrolysis as $H_2SO_4$.

The sodium hydroxide is used in a less than stoichiometric amount with respect to the two reactions $$H_2SO_4 + 2NaOH \rightarrow Na_2SO_4 + 2H_2O$$

$$TiOSO_4 + 2NaOH \rightarrow TiO_2 + Na_2SO_4 + H_2O$$

where the deficiency preferably is selected such that the pH-value at the end of reaction step a) is smaller than 2.

The concentration of the aqueous sodium hydroxide solution is preferably approximately 5 to 10 wt. % NaOH.

The reaction of the stoichiometrically deficient sodium hydroxide solution with the sulphuric acid/titanyl sulphate solution is preferably carried out by first placing the sodium hydroxide solution into a flash or container, heating it to approximately 60–100° C. and then adding the sulphuric acid/titanyl sulphate solution to the sodium hydroxide solution.

Reaction step a) preferably is to be carried out with intensive stirring and at temperatures of 60 to 100° C.

The alkaline pH range in the mixture is to be passed through and left as quickly as possible (in preferably less than 5 mins).

The mixture is preferably to be chilled after reaction step a) to temperatures below 60° C. and then optionally maintained at this temperature for ½ to 2 hours with stirring.

The mixture thus obtained is more or less cloudy (cloudy sol). Such mixtures are used as so-called hydrolysis seeds in the $TiO_2$ sulphate process. They are unsuitable as transparent sols.

After the cooling, flocculation takes place using a monobasic acid and the flocculation precipitate is isolated by filtration. This is nano-disperse titanium dioxide with a particle size of between 1 and 10 nm, with less than 0.1 wt. % carbon and a transparency of at least 99% (see below).

Preferably clarification takes place prior to the addition of the monobasic acid. This can be carried out in a simple fashion by sedimentation, i.e. standing still for at least 12 hours and decanting. However it is also possible to carry out centrifugation or filtration, if necessary with a filter aid.

As a result of the addition of the monobasic mineral acid, the nano-particles formed in a reaction step a) are reversibly flocculated. As a result of their size (preferably 1 to 10 μm) the voluminous flakes obtained can be centrifuged and filtered well. The preferred monobasic acid is hydrochloric acid, and the continued process will be explained in detail with reference thereto. A corresponding procedure is to be followed when other monobasic mineral acids are used.

Preferably the final HCl concentration in the mixture is not to be less than 1 molar; preferably it is adjusted to 1 to 6 molar, particularly preferably 1 to 4 molar for the precipitation of the nano-particles.

Preferred filter cloths are those composed of acid-resistant material (for example polypropylene). Particularly suitable are the acid-resistant filter cloths known to the man skilled in the art which are also used in the sulphate process for the isolation of $TiO_2$ hydrolysate, and membrane filters based on cellulose, cellulose ethers or -esters.

The precipitate is then washed, preferably using the same monobasic acid as also used for the flocculation. In the case of hydrochloric acid, 3 to 6 molar hydrochloric acid is particularly suitable as washing liquid.

The (hydrochloric)acid precipitates (pastes) obtained contain, depending upon the filter assembly and starting material, 20 to 40 and typically approximately 30 wt. % $TiO_2$, the remainder washing acid and possibly a small number of impurities.

If added to the precipitates supply "solutions" (sols) which apart from a slight opalescence (Tyndall effect) are clear, transparent and colourless or almost colourless. In these sols the $TiO_2$ is present entirely as nano-particles, the diameter of which is between 1 and 10 nm.

In this way it is possible to produce strongly acid, virtually entirely transparent (water-clear) sols with up to approximately 20 wt. % $TiO_2$. The transparency of the sols, with a concentration of 5 wt. % $TiO_2$, is greater than 99% (measured in 180°/d-geometry) over the entire visible spectral range.

By the addition of monobasic mineral acids, e.g. HCl, the nano-particles can again be flocculated, filtered and washed. In this form they can be kept for weeks at a temperature of around 0° C. with no change.

Similar sols can also be produced in polar organic solvents, primarily in mono- and multivalent short-chain alcohols, such as e.g. ethanol and butanediol (1.4). The alcohols preferably contain 1 to 10 carbon atoms in the molecule.

By evaporating the liquid and adherent acid at temperatures as low as possible, in a vacuum or over NaOH (room temperature, freeze drying), glass-like xerogels are obtained from the pastes. The xerogels can be fully dispersed in water unless the amount of $H_2O$ and HCl removed is too high.

By dialysis with diluted monobasic mineral acids it is possible to deplete any heavy metal ions which may be present.

In applications in which acid excesses are disturbing, the particles according to the invention can be stabilised in the neutral pH-range in a fundamentally known manner, e.g. using acetylacetone (WO 93/05 875) or hydroxycarboxylic acids (EP-A 518 175).

EXAMPLE

Production of an intermediate layer from nano-crystalline $TiO_2$ in polyvinyl alcohol and of an electroluminescent arrangement containing this intermediate layer.

A) ITO coated glass (manufactured by Balzer) is cut into 20×30 mm² substrates and purified. Here the following steps are carried out successively:

1. flushing for 15 mins with distilled water and Falterol (rinsing agent) in an ultrasonic bath
2. flushing for 2×15 mins with in each case fresh distilled water in an ultrasonic bath,
3. flushing for 15 mins with ethanol in an ultrasonic bath,
4. flushing for 2×15 mins with in each case fresh acetone in an ultrasonic bath,
5. drying with nap-free lens cloths.

The electroluminescent polymer (poly(2-methoxy,5-(2'-ethyl-hexoxy)-1,4-phenylene-vinylene), abbreviated to MEH-PPV, is produced as described by D. Braun et al. App. Phys. Lett. 58(1991) 1892.

A 1 wt-% solution of the electroluminescent polymer MEH-PPV in chloroform is filtered (0.2 μm filter manufactured by Sartorius). The filtered solution is distributed over the ITO layer using a lacquer centrifuge at 1000 rpm. The thickness of the dried film amounts to 105 nm. The roughness of the surface amounts to 5 nm (stylus profilometer Alpha-Step 200 of the Tencor Inst.)

B) the nano-$TiO_2$- particles used are prepared as follows by precipitation from titanylsulphate solution with sodium hydroxide solution:

Preparation of the nano-$TiO_2$ from so-called black liquor:

In a double-walled, heatable 6 1-flask equipped with a mechanical stirrer, thermometer, reflux condenser and bottom valve for the discharge of the product, 1400 ml of a 7.5 wt. % sodium hydroxide solution is heated to 85° C. In a 1 l-three-neck flask equipped with a stirrer, reflux condenser, electric heater and bottom discharge valve, 804 ml of a black liquor containing $FeSO_4$ and produced in accordance with the sulphate process ($d_{60°\ C.}$=1.566 g/ml; 13.83 wt. % $TiO_2$ corresponds to 217 g/l; 28.39 wt. % free $H_2SO_4$) is heated to 60° C. With intensive stirring the black liquor is caused to flow to the sodium hydroxide solution within 3 mins. A dense, dark precipitate is formed temporarily. As a result of the neutralisation the temperature of the mixture rises to 92° C. Stirring is continued for approximately 5 minutes whereupon the mixture is only slightly cloudy. Then it is cooled to 30° C. within 20 mins with further stirring.

244 ml of semiconcentrated hydrochloric acid (20.6 wt. %, approx. 6.2 molar) is added dropwise to 244 ml of a mixture produced in this way within 5 mins at room temperature. A white precipitate forms. After standing for 1 hour to complete the precipitation, the precipitate is filtered on a cellulose nitrate filter and washed in portions with a total of 900 ml of the above mentioned hydrochloric acid.

32.5 g of a white paste comprising 34.5 wt. % $TiO_2$ (corresponding to 58% of the theory), 14.7 wt. % HCl, 2.7 wt. % $SO_4^{2-}$ and 170 ppm Fe is obtained.

10.8 g of the paste is dissolved in 32.1 g distilled water. The "solution" contains approximately 8.3 wt. % $TiO_2$ and 3.6 wt. % HCl and is virtually clear.

The nano-$TiO_2$-particles have a diameter of 4.5 nm, determined by ultra-centrifuge (solvent: water/HCl) and contain, for stabilisation, approximately 50 wt. % HCl relative to $TiO_2$.

The polyvinyl alcohol used is Moviol 8-88 (Hoechst AG).

C) Preparation of an EL arrangement containing the intermediate layer according to the invention.

A solution consisting of 1 part by weight 8 wt-% nano-particle-$TiO_2$-solution (corresponding to Example B) in water and 2 parts by weight of 2.5 wt-% Moviol solution in water is produced.

This solution is filtered (0.2 μm filter, manufactured by Sartorius). The filtered solution is applied to the MEH-PPV film and distributed by the lacquer centrifuge at 3000 rpm. The dried overall layer thickness of the 2-layer construction amounts to 159 nm. The roughness of the surface amounts to 8 nm (stylus profilometer Alpha Step 200 of the Tencor Inst.).

The double layer system produced in this way is then vapor deposited with Al-electrodes. For this purpose, using a perforated mask, isolated Al-points with a diameter of 3 mm are vaporized onto the $TiO_2$/Moviol surface. During the vapour deposition a pressure of less than $10^{-5}$ mbar prevails in the vapour deposition apparatus (Leybold).

The ITO-layer and the Al-electrode are connected to a voltage source via electric supply lines. When the voltage is increased a current flows through the double layers. From a voltage of 5 V electroluminescence is detectable. The colour of the electroluminescence is yellow-red.

The electroluminescence intensity depends upon the direct current which flows through the arrangement with a variable voltage. The LED with the 2-layer construction, i.e. with the $TiO_2$/Moviol layer between the electro-luminescent polymer layer (MEH-PPV) and the cathode, luminesces distinctly more brightly than in case of the 1-layer construction with the same current.

The electroluminescence intensity of the EL arrangement with the $TiO_2$/Moviol intermediate layer is distinctly higher, in the case of equal currents, than in the system without the $TiO_2$/Moviol intermediate layer (comparison like example C, but without the intermediate layer). At 20 V the luminescence in both of the EL arrangements is 10 cd/m². However, with the $TiO_2$/Moviol intermediate layer a current of only 0.5 mA flows whereas without the $TiO_2$/Moviol intermediate layer the current at 20 V is 30 mA. If the intermediate layer consists only of Moviol, no current flows and no electro-luminescence is detected.

We claim:

1. An intermediate layer in electroluminescent arrangements containing finely divided inorganic nano-particles of from 1–100 nm which are dispersed in a polymer binder, and the intermediate layer having a film thickness of 10 to 150 nm.

2. An intermediate layer according to claim 1 containing metal oxides or semiconductor compounds from the III and V main groups of the Periodic System or semiconductor compounds from the II and VI main groups of the Periodic System as inorganic particles.

3. An intermediate layer according to claim 2, containing $TiO_2$, $SnO_2$, ZnO, $WO_3$, $Al_2O_3$, $Fe_2O_3$, GaP, AlN, ZnSe, CdSe or CdS as inorganic particles.

4. An intermediate layer according to claim 1 containing titanium dioxide as inorganic particles.

5. An intermediate layer according to claim 1, where the inorganic particles in the polymer binder amount to 0.1 to 90 wt. % relative to the overall intermediate layer.

6. An intermediate layer according to claim 1, characterised in that the inorganic particles possess a band gap of at least 1 eV.

7. An electroluminescent arrangement containing one or more intermediate layers according to claim 1.

8. An electroluminescent arrangement comprising the intermediate layer of claim 1, an electroluminescent layer and a cathode, and wherein the intermediate layer is located between the electroluminescent layer and the cathode.

9. An electroluminescent arrangement comprising the intermediate layer of claim 1, an electroluminescent layer and an anode, and wherein the intermediate layer is located between the electroluminescent layer and the anode.

10. An electroluminescent arrangement comprising two intermediate layers of claim 1, an electroluminescent layer, an anode, and a cathode, and wherein one intermediate layer is located between the electroluminescent layer and the anode and the other intermediate layer is located between the electroluminescent layer and the cathode.

* * * * *